United States Patent [19]

Wingerter

[11] 4,043,660

[45] Aug. 23, 1977

[54] DEVICE FOR CORRECTING POSITIVE FILM FOR PHOTOCOMPOSITION

[75] Inventor: Franz Adolf Wingerter, Berlin, Germany

[73] Assignee: H. Berthold AG, Berlin, Germany

[21] Appl. No.: 697,989

[22] Filed: June 21, 1976

[30] Foreign Application Priority Data

Aug. 19, 1975 Germany ............................ 2537357

[51] Int. Cl.² ...................... G03B 13/28; G03B 27/32; G03B 27/52

[52] U.S. Cl. ........................................ 355/43; 355/45; 355/77

[58] Field of Search ...................... 354/10, 77; 355/77, 355/66, 39, 18, 40, 65, 60, 57, 44, 53, 43, 45

[56] References Cited

U.S. PATENT DOCUMENTS

| | | | |
|---|---|---|---|
| 2,558,605 | 6/1951 | Coutant et al. | 355/43 |
| 2,654,289 | 10/1953 | Flynn | 355/40 |
| 2,740,324 | 4/1956 | Cahill | 355/40 |
| 2,744,443 | 5/1956 | Higonnet et al. | 355/43 |
| 2,752,818 | 7/1956 | Gehring | 355/43 X |
| 3,185,026 | 5/1965 | Carlson et al. | 355/77 X |
| 3,315,561 | 4/1967 | Garcia Boutigue | 355/45 X |
| 3,438,708 | 4/1969 | Thorne-Thomsen | 355/77 |
| 3,642,370 | 2/1972 | Meredith et al. | 355/75 |
| 3,802,773 | 4/1974 | Schneider | 355/43 |
| 3,890,045 | 6/1975 | Bernstein et al. | 355/44 X |

*Primary Examiner*—Donald A. Griffin
*Attorney, Agent, or Firm*—Andrew R. Basile

[57] ABSTRACT

A device for correcting positive film for photocomposition using a photographic method which comprises first projecting an original film onto a final film with the defective area rendered unexposed, then projecting the correct replacement material onto the unexposed portion of the final film, both projection methods using an optical system with a movable mirror.

10 Claims, 9 Drawing Figures

DEVICE FOR CORRECTING POSITIVE FILM FOR PHOTOCOMPOSITION

BACKGROUND OF THE INVENTION

I. Field of the Invention

This invention relates to the correction of photocomposition film and specifically the correction of such film by manipulation of the correction area under ambient light conditions and the projection of the correction via an optical system employing a movable mirror.

II. Description of the Prior Art

A procedure known in the art of preparing final negative or positive films covers the area which is to be corrected on a layout with red shading. The red color covers every detail of the area to be changed; however, it is so sharply defined that the masking required for delineation from the neighboring characters by the segments of a correction film will at no point result in contact between the red color and the masking when projected. Furthermore, the red shading and masking allow for visual optical alignment but will be nontransparent to light on exposure. In the known correction procedure the delineation of a given location on the correction film, which replaces the red-shaded area in the original film, is determined by respectively cut conventional masking sheets. This requires that both the original film and the correction film be aligned with each other, after which the corrected portion of the latter is transferred by exposure onto the final film location. The area of the final film which receives the corrected portion of the correction film had previously remained unexposed because of the red shading on the original film. The advantage of the prior art is that, under full visual control, corrections can be made on positive film without requiring such time consuming methods as scraping, cutting, or gluing at the location to be corrected.

SUMMARY OF THE INVENTION

The instant invention defines a device and method for correcting positive film.

It is an object of this invention to keep the correction film mobile by means of simple manipulation, all the while maintaining full visual control. This manipulation is done in such a manner that each location used for correction, having been masked and delineated, can be projected to any desired location of a focusing screen. Thereby, the use of pre-cut, conventional masking sheeting is made superflous. The covered, delineated location on the correction film can be moved to any desired location on the focusing screen allowing repetition of any given word, symbol, image, or sentence fracture.

It is a further object of this invention to execute all of the foregoing manipulations under ambient light conditions, employing only a single light source. This object is achieved by providing for the projection of a masked, delineated location on the correction film via an optical system of mirrors onto any given location on a focusing screen. The mirror in the optical system is movable, thus, allowing for projection of the corrected area onto the final film which is located so as to be superimposable on the focusing screen.

Another object of the instant invention is to provide a correction film that is movable in its plane in the $x$ and $y$ directions to delineate the location on the correction film. Two pairs of masking devices are provided. These masking devices are located at right angles to each other and are independently mobile in the $x$ and $y$ directions respectively.

Still another object of this invention is to contain the correction film in a movable carrier, capable of being moved in the $x$ direction by means of a crank. Said carrier is simultaneously contained in a transverse carrier, capable of sliding in the $y$ direction by means of a second cranking mechanism. It is a further characteristic of the invention that the shafts of the cranks are so fashioned as to be capable of carrying drive pinions for cables, the cables being fastened to gear wheels at opposite sides of the frame and at right angles to the $x$ axis.

It is still another object of this invention to independently adjust the two masking sheets, those in the $x$ and $y$ directions respectively, by means of cranks, cable trains, and rack and pinion mechanisms.

It is finally an object of the present invention to arrange the crank shafts vertically with respect to each other and in such a manner that the cranks serving respectively for moving the correction film in the $x$ or $y$ direction can be engaged by the respective drive shafts.

Additional objects and characteristics of the present invention will become apparent to those skilled in the art of film correction when the accompanying description of one example of the best mode contemplated for practicing the invention is read in conjunction with the accompanying drawings.

BRIEF DESCRIPTION OF THE DRAWINGS

The description herein makes reference to the accompanying drawings wherein like reference numerals refer to like components throughout the several views, and in which.

DETAILED DESCRIPTION OF THE PREFERRED EMBODIMENT

Figure 1:
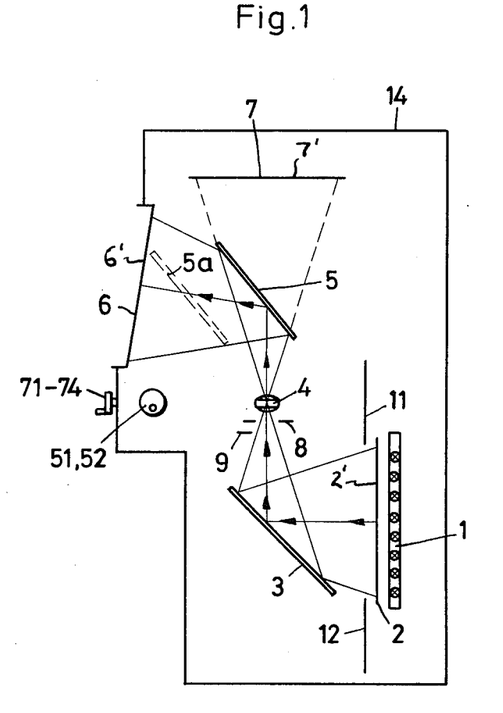
FIG. 1 is a schematic representation of a film correction device constructed in accordance with the principles of the present invention.

Referring now to the drawings and, in particular, to FIG. 1 where the well-known principle of a reproduction camera is being applied. In the image plane 2' a correction film 2, either as a positive or negative transparency, is located; this will be described in further detail in FIG. 3. Behind the transparency an illuminated inspection table 1 is located, representing a variable light source. The light emitted from this source projects the image resulting from the transparency onto a first reflection mirror 3, through lens 4, on to the movable reflection mirror 5, and then on to the focusing plane 6'. When the reflection mirror 5 is moved into its location 5a, the same image is projected onto the light sensitive recording plane 7' of the final film 7. The optical planes, i.e. image plane 2', focusing plane 6', and recording plane 7', are in a fixed optical relationship to each other. In the given example the reproduction ratio is 1:1; this can, however, be a different ratio without departing from the principle of the invention. Due to the fact that the focusing plane 6' and the recording plane 7' of the final film 7 are in a fixed, unchangeable relation to each other, a guarantee is provided that the image projected onto the focusing plane 6', or a respectively chosen image section of the focusing plane 6', can indeed by reprojected onto the recording plane 7'. In order to be able to locate a given chosen section of the correction film 2 at any chosen location of the focusing plane 6' (FIG. 2), the correction film 2 is so arranged as to be movable in its plane, as is further detailed in FIG. 3. In order to be able to delineate sections of an image, such as individual words, lines, or symbols of the correction film for purposes of exposure, movable masking slides 11, 12, 75, and 76 are provided in close proximity to the correction film 2. These masking slides are colored in such a manner that the covered sections of the correction film 2 are still recognizable on the focusing plane 6'. Since the spectral sensitivity of masking slides 11, 12, 75, and 76 is outside the light sensitivity of the final film 7 in the recording plane 7', no exposure occurs. Nevertheless, the covered parts of the correction film 2 are visible on focusing plane 6' to facilitate choosing the next segment to be used.

Figure 4:
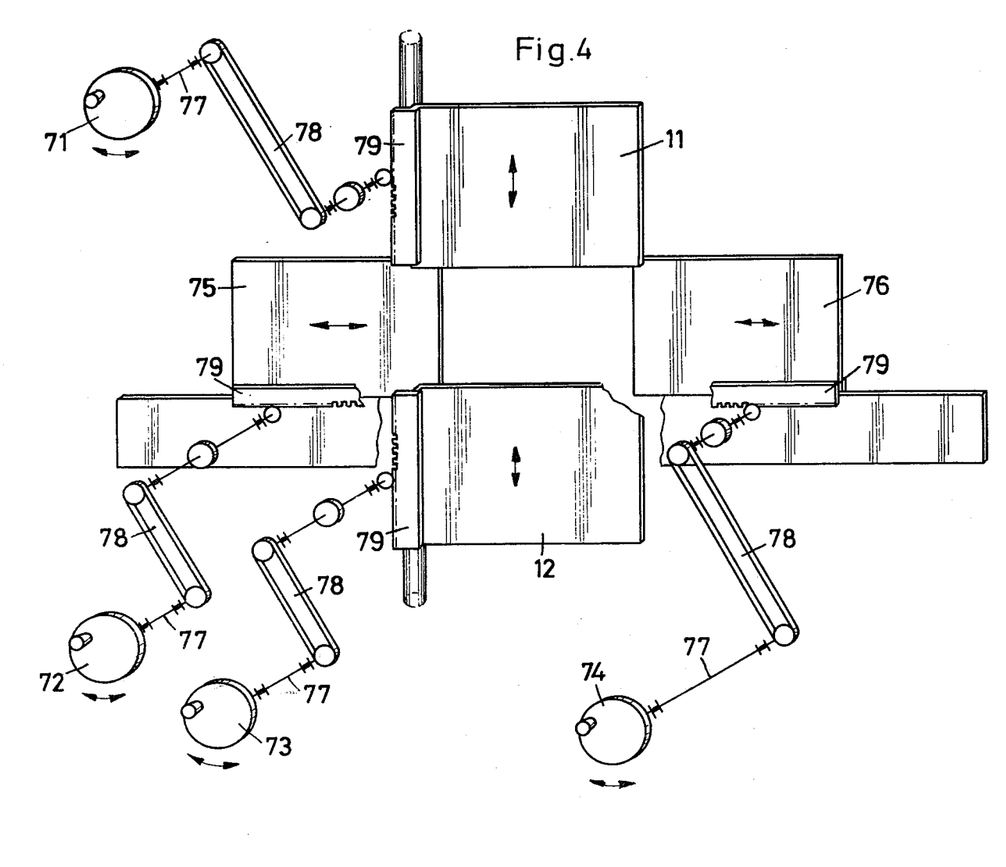
FIG. 4 is a front view of the mechanism for moving the components of a masking device.

The masking slides 11, 12, 75, and 76 can be moved by means of cranks 71 to 74 (FIG. 4). Correction film 2 can be moved by means of cranks 51 and 52, which are arranged on the sides of housing 14 (FIG. 1). A shutter 8 serves the purpose of controlling the exposure time in relation to correction film 2 and the sensitivity of the final film 7. For special circumstances a filter 9 can be inserted into the optical path.

Figure 2:
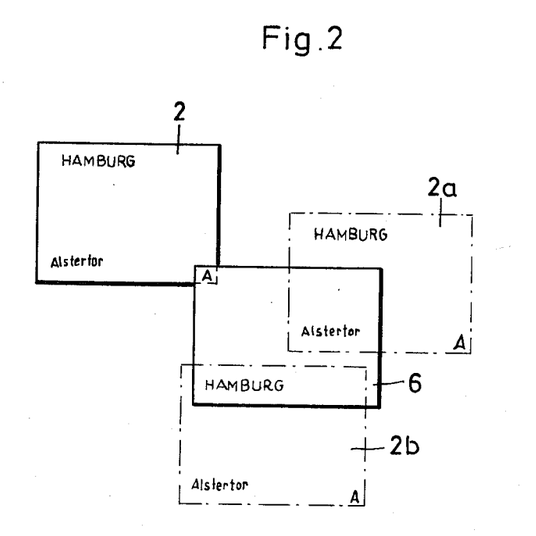
FIG. 2 is an illustration showing the different positions of a correction film with respect to the focusing plane of the film correcting device.

FIG. 2 demonstrates how a correction film 2 can be moved in any desired position with respect to the focusing plane 6'; only positions 2a and 2b are presented in the example.

Figure 3:
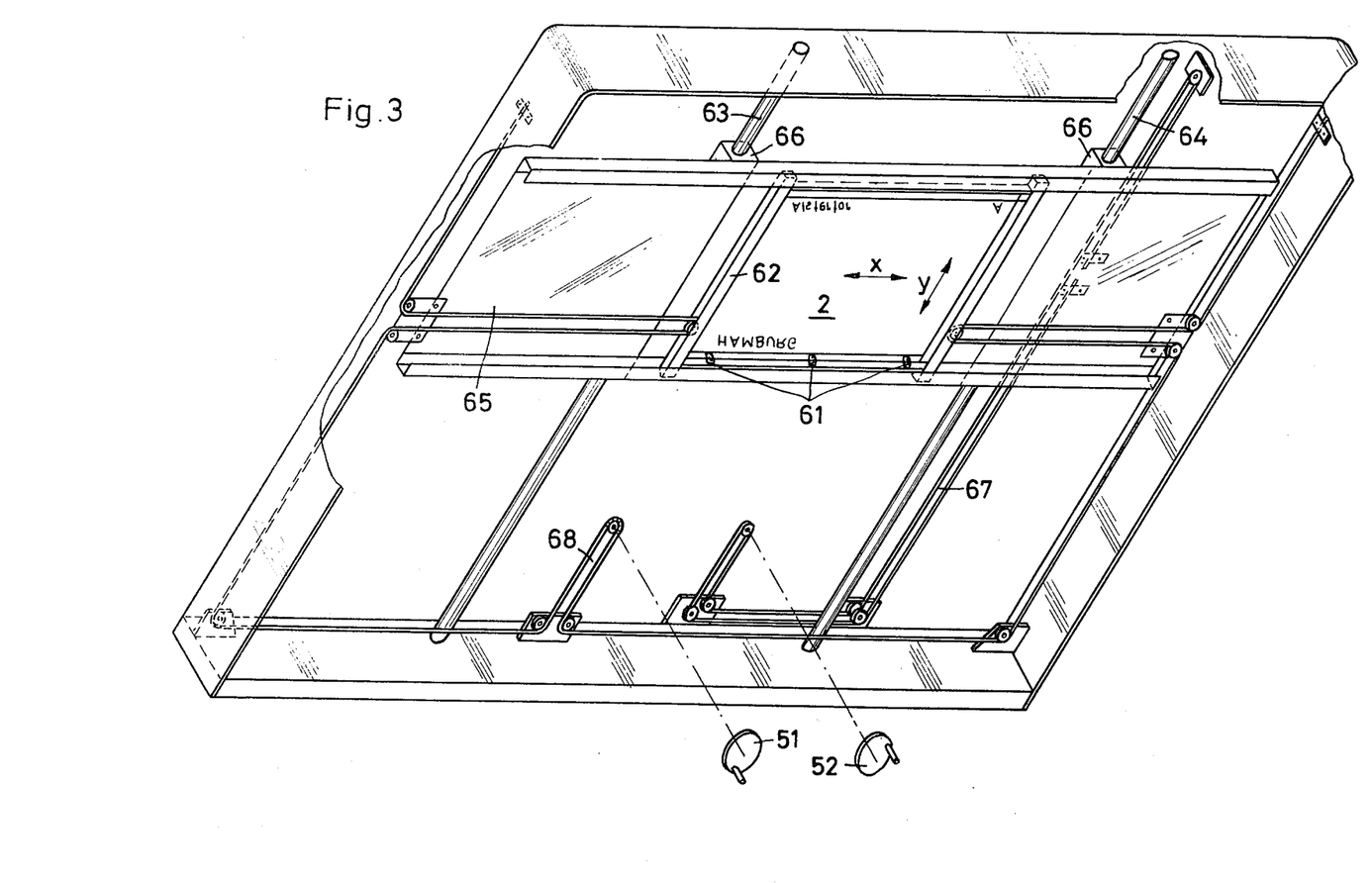
FIG. 3 is a perspective view of the mechanism for moving the correction film.
Figure 8:
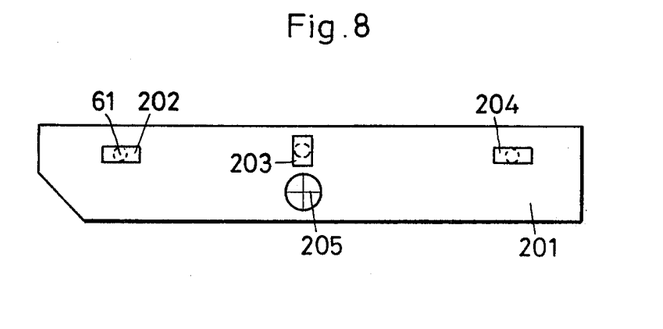
FIGS. 8 and 9 are representations of two indexing strips.

FIG. 3 shows a specific design of the mechanism for moving about the correction film 2. The correction film 2 is inserted into carrier 62 by means of an indexing strip 201 (FIG. 8). Guide rods 63 and 64 carry a transverse carrier 65, which is fastened to slide bars 66. By turning crank 52, the transverse carrier 65 is moved in the $y$ direction by means of drive pulley 67. Within the transverse carrier 65, the mounting carrier 62 is arranged, using slide bars which are not represented in the drawing. This mounting carrier can be moved in the $x$ direction by means of drive pulley 68 and crank 51; during such movement no translational change in the $y$ direction occurs. Analogously, no change in the $x$ direction occurs when the transverse carrier is moved in the $y$ direction. Thus, the correction film 2 can be moved to any desired position, corresponding to its respective size.

FIG. 4 shows how the masking slides 11, 12, 75, and 76 can be moved. By turning cranks 71, 72, 73, and 74 located, according to FIG. 1, at the central console, the masking slides can be driven via universal joints 77, drive belt 78, and rack and pinion arrangements 79. Thus, any masking arrangement can be achieved, while visual control is maintained on the focusing plane. As previously mentioned, the masking slides are specially colored so as to allow visual recognition of the masked sections on the focusing plane; during exposure of the final film these covered sections of correction film 2 remain unexposed.

Figure 6:
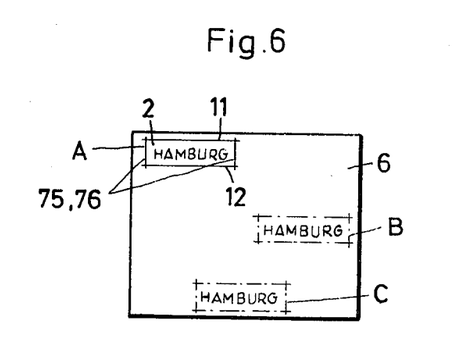
FIG. 6 is an illustration showing the various possible positions of the correction film with the masking devices in place.

FIG. 6 demonstrates an example of the masking slides 11, 12, 75, and 76 in place, driven respectively by cranks 51 and 52 and moved to the respective locations by the carriers 62 and 65 which contain the correction film 2. By way of example, the word HAMBURG on the correction film is visibly located on the focusing plane 6' in position A.

The masking slides are represented by lines 11, 12, 75, and 76. Should the word HAMBURG have to be repeated on different locations of the final film, cranks 71 to 74 of the masking slides are connected to cranks 51 and 52 and then moved to different positions (locations B and C).

Figure 5:
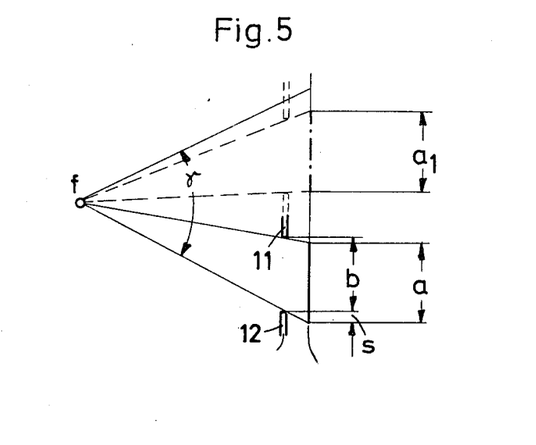
FIG. 5 is an illustration showing the location of the working plane with respect to the plane in which the correction film is located.

FIG. 5 shows the respective location of the plane in which the masking slides operate, versus the image plane 2'. As shown in FIG. 1, the masking slides 11, 12 or 75, 76 of necessity are separated a certain distance from the correction film 2. According to the law of optical rays, with a change of the angle $\gamma$, the distance $s$ would also change. This would mean that during synchronous movement of the masking slides and the correction film, the defined field $a$ of correction film 2, in relation to focal point $f$ would also move with respect to the masking position $b$. It is therefore a unique characteristic of the instant invention that the masking slide plane changes with relation to the image plane 2' in such a manner than an unchanged image field $a$ can be projected. This is achieved by means of a differentiation in the teeth of racks 79 towards their ends. (See FIG. 4.)

Figure 7:
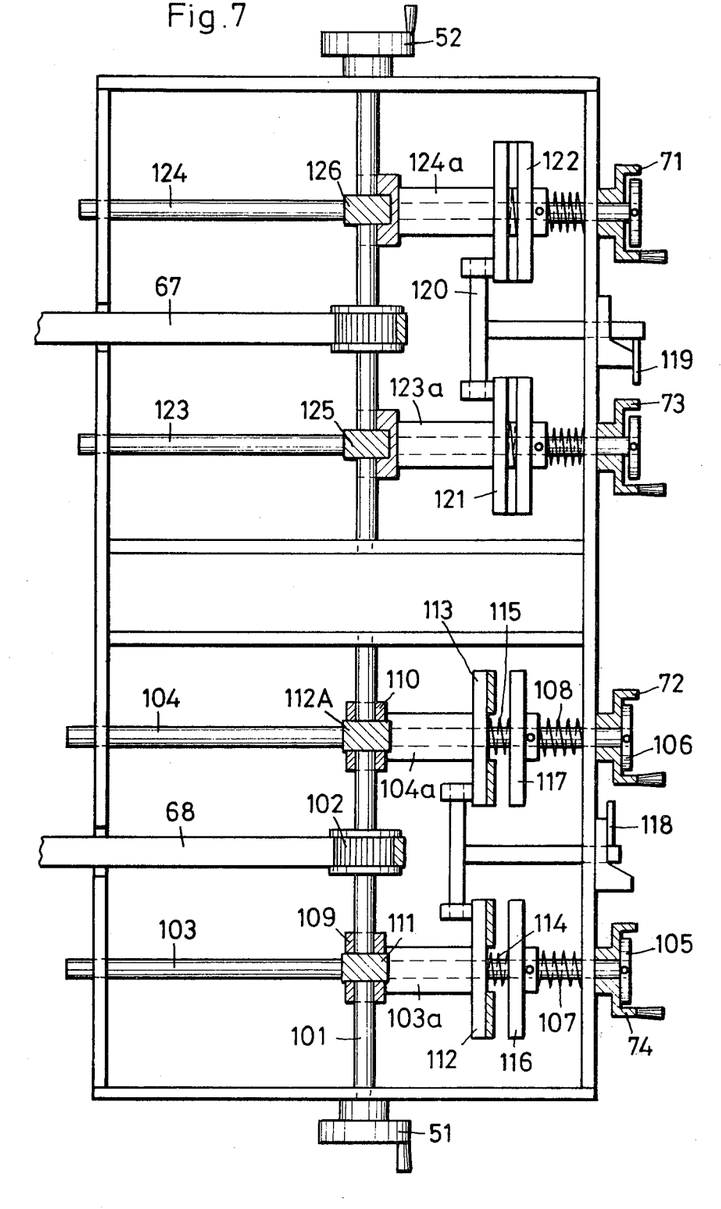
FIG. 7 is an illustration of the mechanical components needed for locating the correction film and the masking devices in a given position.

FIG. 7 shows the cranking mechanism for positioning the masking slides and the correction film as needed for FIG. 4 and FIG. 3. Crank 51 is used, as shown in FIG. 3, to move the transverse slide 65 in the $y$ direction, while crank 52 serves for locating the mounting carrier 62 in the $x$ direction. Cranks 71 to 74 move masking slides 11, 12, 75, and 76, as shown in FIG. 4, to a given desired position. The mechanism is designed in such a manner that the drive shafts of cranks 71 to 74 can be coupled to cranks 51 and 52 in any set location, so as to allow for a movement of a given masked field of correction film 2 to any desired position on focusing plane 6, and thereby similarly to any desired location of the final film 7.

For better understanding, a coupled procedure and an uncoupled procedure are described. In FIG. 7, when crank 51 is turned, shaft 101 turns, together with a gear wheel 102 fastened thereon; this gear wheel drives the transportation cable 68 which moves the mounting-carrier 62 in the $x$ direction (FIG. 3). When turning cranks 72 and 74, masking slides 75 and 76 moves in the $y$ direction (FIG. 4). The friction disks 105 and 106, located at the ends of masking-slide drive shafts 103 and 104, are forced against the hand wheels, or cranks 74 and 72 by the pressure exerted by springs 107 and 108, so that the handwheels are driven by frictional contact.

Gear wheels 109 and 110, which are permanently engaged with the gear wheels 111 and 112A of shaft 101, are located on shafts 103 and 104. In addition, shafts 103 and 104 respectively carry the freely movable coupling disks 112 and 113, which are kept free of their counter disks 116 and 117 by means of springs 114 and 115. The coupling disks 112 and 113 are connected by bushings 103a, 104a, 103a, and 124a to gear wheels 109 and 110. Springs 114 and 115 prevent the turning of coupling disks 112 and 113 when cranks 74 and 72 are turned. For the cranks where the masking slides 75 and 76 are to be coupled to the rotation of crank 51, lever 118 has to be moved. This lever, 118 or 119, moves a coupling slide 120 and engages the coupling disks to a driving unit 121 and 122. Shafts 123 and 124 move a small distance and disconnect the friction drive engagement on cranks 71 and 73. Under this configuration, any turning of crank 52 now causes, via gear wheels 125 and 126, a turning of the engaged clutches 121 and 122. This results in synchronous movement of the transverse carrier 65 (FIG. 3) in the y direction, together with the two masking slides 11 and 12 (FIGS. 1 and 4). Thus, the two opposing masking slides always move together either in the x or y direction, movement being in either case always parallel to the edges of the masking slides at rest.

Figure 9:
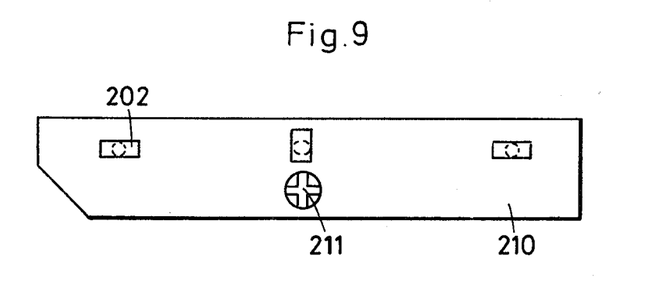

FIGS. 8 and 9 show two indexing strips, which are preferably made of steel. Indexing strip 201 can be aligned on an illuminated inspection table 1 and be fastened to the correction film 2; it can then be inserted into pins 61 according to FIG. 3. Similar indexing pins are located on the focusing plane 6, into which indexing strip 210 can be inserted. When cross hairs 205 are superimposed on cross hairs 211, followed by exposure of the locations to be transferred, additional supplemental corrections can be made by positioning the correction film with indexing strip 201 on the pins on the focusing plane 6.

The device, according to the instant invention, may be used both for the correcting of an original film or for rearranging purposes. When correcting an original film, the misspelled words, lines, or wrongly drawn pictures are covered on the original film by coloring them red; the original film is then positioned in the indexing pins before the illuminated inspection table 1 and exposed in a fixed position for reproduction on the final film 7. The correction film 2 is inserted into the indexing pins in front of the illuminated inspection table 1 and covered by the masking slides 11, 12, 75, and 76. The original film is positioned on the indexing pins of the focusing plane 6', and the masked sections of the correction film 2 are fitted in place on the original film in the focusing plane 6; then the corrections are exposed onto the final film 7.

For rearranging, the original film is inserted in front of the illuminated inspection table 1; the layout or screen is installed on the focusing plane 6. The individual sections of the original film are fitted according to layout or screen, while the undesired sections of the original film are masked. This is followed by exposure onto a final film, as needed additional sections can be installed, masked, and then exposed. For the case that several original designs are to be combined, additional original films are to be installed in front of the illuminated inspection table 1.

Although only one example of the present invention has been disclosed, it should be understood by those skilled in the art of film correction that other forms may be had, all coming within the spirit of the invention and the scope of the appended claims.

What is claimed is as follows:

1. A method for correcting positive film for photocomposition using an original defective film, a correction film containing a desired replacement material, a final film, and an optical system of mirrors used to correctly align and project said replacement material, said method comprising:
   covering a defective area of said original film with a colored shading;
   projecting said original film onto said final film by way of said system of mirrors, said shading on said original film causing an unexposed area on said final film;
   placing said correction film in the same spot from which said original film was projected onto said final film;
   positioning original film in a focusing plane which lies in a fixed position respective to said final film;
   moving one of said mirrors in said optical system into a predetermined position which permits projecting of said correction film onto said original film which is lying in said focusing plane;
   delineating said replacement material on said correction film by a manipulation of said correction film, said manipulation additionally capable of aligning said replacement material with said colored shading on said original film which is lying in said focusing plane; and
   removing one of said mirrors so that said replacement material, delineated and aligned, can be directly exposed to said final film, and because of previous alignment of said replacement material with said colored shading, said replacement material will be exposed to said unexposed area on said final film.

2. The method for correcting positive film described in claim 1 wherein said covering of said defective area with said colored shading is carried out in such a manner that each detail of said area is completely covered, but is so sharply defined that the subsequent masking of said correction film will at no position result in contact between said colored shading and said plurality of masking slides when said corrected material from said correction film is exposed.

3. The method for correcting positive film described in claim 1 wherein said colored shading and said corrected material are rendered visually aligned but are non-transparent for the light needed for exposure.

4. The method for correcting positive film for photocomposition described in claim 1 wherein said manipulation of said correction film comprises moving said correction film in a plurality of directions within its plane.

5. A device for correcting positive film for photocomposition comprising:
   a housing, said housing containing means for holding an original film carrying a red-shaded area to delineate a defective area;
   means for holding a final film in a recording plane;
   means for manipulating a correction film to delineate a desired replacement character or characters to take the place of said red-shaded area in said final film; and
   an optical system comprising two mirrors, a first convex lens mirror and a second movable mirror, a single light source, an image plane where said original film and said correction film are alternately located, a focusing plane in which said original film is selectively located, and said recording plane, said optical system designed to project said desired replacement characters onto said final film by successive projections of first said original film and then said correction film.

6. The device for correcting positive film for photocomposition in claim 5 wherein said means for manipulating said correction film comprise a plurality of masking mechanisms independently adjustable, each of said masking mechanisms comprising a masking slide associated with a rack and pinion, said rack and pinion connecting to a transportation band, said transportation band coupled to a drive shaft, said drive shaft terminating in a crank, the operation of said crank delineating said desired replacement characters on said correction film.

7. The device for correcting positive film for photocomposition described in claim 6 wherein said correction film is further manipulated in the $x$ and $y$ directions within its plane, movement in the $x$ direction being accomplished by fastening said correction film onto a mounting carrier which is movable in the $x$ direction by means of a carrier crank and is movable in the $y$ direction by means of a transverse carriage in which said mounting carrier is contained, said transverse carriage being moved by said carriage crank.

8. The device for correcting positive film for photocomposition described in claim 7 wherein each of said masking mechanism cranks can be selectively coupled to said carrier crank and said carriage crank to effect a simultaneous movement of said masking slides with said correction film.

9. The device for correcting positive film for photocomposition in claim 5 further characterized by a plurality of indexing strips which are provided for the purpose of superimposing said correction film onto said original film in said focusing plane.

10. The device for correcting positive film for photocomposition in claim 5 wherein said single light serves for both visual examination on said focusing plane and exposure to said final film.

* * * * *